United States Patent
Sala et al.

(10) Patent No.: US 10,318,434 B2
(45) Date of Patent: Jun. 11, 2019

(54) OPTIMIZED HOPSCOTCH MULTIPLE HASH TABLES FOR EFFICIENT MEMORY IN-LINE DEDUPLICATION APPLICATION

(71) Applicant: SAMSUNG ELECTRONICS CO., LTD., Suwon-si, Gyeonggi-do (KR)

(72) Inventors: Frederic Sala, Los Angeles, CA (US); Chaohong Hu, San Jose, CA (US); Hongzhong Zheng, Sunnyvale, CA (US); Dimin Niu, Sunnyvale, CA (US); Mu-Tien Chang, Santa Clara, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/905,746

(22) Filed: Feb. 26, 2018

(65) Prior Publication Data

US 2018/0181495 A1 Jun. 28, 2018

Related U.S. Application Data

(63) Continuation of application No. 15/161,136, filed on May 20, 2016, now Pat. No. 9,983,821.

(Continued)

(51) Int. Cl.
*G06F 12/10* (2016.01)
*G06F 12/1018* (2016.01)
(Continued)

(52) U.S. Cl.
CPC .......... *G06F 12/1018* (2013.01); *G06F 3/065* (2013.01); *G06F 3/0619* (2013.01);
(Continued)

(58) Field of Classification Search
CPC ...... G06F 3/0641; G06F 3/0619; G06F 3/065; G06F 3/0685; G06F 12/1018
See application file for complete search history.

(56) References Cited

U.S. PATENT DOCUMENTS 6,438,560 B1 8/2002 Loen
7,650,460 B2 1/2010 Cheriton
(Continued)

OTHER PUBLICATIONS

Yang et al. "DEBAR a scalable high performance deduplication storage system for backup and archiving" 2010 IEEE International Symposium on Parallel & Distributed Processing (IPDPS) pp. 19-23. Apr. 2010 (Year: 2010).

(Continued)

*Primary Examiner* — Ryan Bertram
(74) *Attorney, Agent, or Firm* — Lewis Roca Rothgerber Christie LLP

(57) ABSTRACT

A method of memory deduplication includes identifying hash tables each corresponding to a hash function, and each including physical buckets, each physical bucket including ways and being configured to store data, identifying virtual buckets each including some physical buckets, and each sharing a physical bucket with another virtual bucket, identifying each of the physical buckets having data stored thereon as being assigned to a single virtual bucket, hashing a data line according to a hash function to produce a hash value, determining whether a corresponding virtual bucket has available space for a block of data according to the hash value, sequentially moving data from the corresponding virtual bucket to an adjacent virtual bucket when the corresponding virtual bucket does not have available space until the corresponding virtual bucket has space for the block of data, and storing the block of data in the corresponding virtual bucket.

6 Claims, 6 Drawing Sheets

Related U.S. Application Data

(60) Provisional application No. 62/314,918, filed on Mar. 29, 2016.

(51) Int. Cl.
*G06F 12/0802* (2016.01)
*G11C 29/00* (2006.01)
*G06F 3/06* (2006.01)

(52) U.S. Cl.
CPC .......... *G06F 3/0641* (2013.01); *G06F 3/0685* (2013.01); *G06F 12/0802* (2013.01); *G11C 29/74* (2013.01)

(56) References Cited

U.S. PATENT DOCUMENTS

| | | |
|---|---|---|
| 7,818,495 B2 | 10/2010 | Tanaka et al. |
| 8,065,476 B2 | 11/2011 | Cheriton |
| 8,219,534 B2 | 7/2012 | Rao et al. |
| 8,230,168 B2 | 7/2012 | Cheriton |
| 8,462,781 B2 | 6/2013 | McGhee et al. |
| 8,504,791 B2 | 8/2013 | Cheriton et al. |
| 8,612,673 B2 | 12/2013 | Cheriton |
| 8,886,508 B2 | 11/2014 | Gullapalli et al. |
| 8,938,469 B1 | 1/2015 | Keen et al. |
| 8,938,580 B2 | 1/2015 | Cheriton |
| 9,069,810 B2 | 6/2015 | Kim et al. |
| 9,110,789 B1 | 8/2015 | Hayes et al. |
| 9,116,812 B2 | 8/2015 | Joshi et al. |
| 9,135,383 B2 | 9/2015 | Gullapalli et al. |
| 9,141,554 B1 | 9/2015 | Candelaria |
| 9,141,625 B1 | 9/2015 | Thornewell et al. |
| 9,148,387 B2 | 9/2015 | Lin et al. |
| 9,170,940 B2 | 10/2015 | Van De Ven |
| 9,177,025 B2 | 11/2015 | Bensberg et al. |
| 9,177,028 B2 | 11/2015 | Chambliss et al. |
| 9,298,707 B1 | 3/2016 | Zhang et al. |
| 9,471,500 B2 | 10/2016 | Kruus et al. |
| 9,489,239 B2 | 11/2016 | Jung et al. |
| 9,501,421 B1 | 11/2016 | Cheriton |
| 9,502,139 B1 | 11/2016 | Cheriton |
| 9,520,193 B2 | 12/2016 | Cheriton |
| 2009/0265399 A1 | 10/2009 | Cannon et al. |
| 2011/0258404 A1 | 10/2011 | Arakawa et al. |
| 2011/0307447 A1 | 12/2011 | Sabaa et al. |
| 2012/0102260 A1 | 4/2012 | Kawamura et al. |
| 2012/0158674 A1 | 6/2012 | Lillibridge |
| 2012/0166448 A1 | 6/2012 | Li et al. |
| 2013/0024645 A1 | 1/2013 | Cheriton et al. |
| 2013/0151759 A1 | 6/2013 | Shim et al. |
| 2013/0275699 A1 | 10/2013 | Cheriton |
| 2014/0115260 A1 | 4/2014 | Maybee et al. |
| 2014/0188819 A1 | 7/2014 | Bagal et al. |
| 2014/0281361 A1 | 9/2014 | Park et al. |
| 2014/0301394 A1 | 10/2014 | Arad et al. |
| 2014/0334494 A1 | 11/2014 | Lin et al. |
| 2015/0019507 A1 | 1/2015 | Aronovich |
| 2015/0019815 A1 | 1/2015 | Aronovich |
| 2015/0026135 A1 | 1/2015 | Aronovich |
| 2015/0074339 A1 | 3/2015 | Cheriton |
| 2015/0127621 A1 | 5/2015 | Kuo |
| 2015/0161000 A1 | 6/2015 | Kim et al. |
| 2015/0286639 A1 | 10/2015 | Bordawekar |
| 2016/0011816 A1 | 1/2016 | Aizman |
| 2016/0098353 A1 | 4/2016 | Shiu |
| 2016/0239511 A1 | 8/2016 | Therrien et al. |
| 2016/0283165 A1 | 9/2016 | Robinson et al. |
| 2016/0283391 A1 | 9/2016 | Nilsson et al. |
| 2016/0291891 A1 | 10/2016 | Cheriton |
| 2017/0031946 A1 | 2/2017 | Sarab |
| 2017/0109049 A1 | 4/2017 | Cheriton |

OTHER PUBLICATIONS

U.S. Office Action dated Dec. 27, 2018, issued in U.S. Appl. No. 15/476,757 (15 pages).

U.S. Office Action dated Dec. 28, 2018, issued in U.S. Appl. No. 15/498,371 (18 pages).

FIG. 5A

| | PB0 | PB1 | PB2 | PB3 | PB4 | PB5 | PB6 |
|---|---|---|---|---|---|---|---|
| VB0 | X0 | X1 | X2 | X3 | | | |
| VB1 | | X0 | X1 | X2 | X3 | | |
| VB2 | | | X0 | X1 | X2 | X3 | |
| VB3 | | | | X0 | X1 | X2 | X3 |

FIG. 5B

| | PB0 | PB1 | PB2 | PB3 | PB4 | PB5 | PB6 |
|---|---|---|---|---|---|---|---|
| VB0 | 1 | 1 | 0 | 1 | | | |
| VB1 | | 0 | 1 | 0 | 1 | | |
| VB2 | | | 0 | 0 | 0 | 1 | |
| VB3 | | | | 0 | 0 | 0 | 0 |

FIG. 5C

| | PB0 | PB1 | PB2 | PB3 | PB4 | PB5 | PB6 |
|---|---|---|---|---|---|---|---|
| VB0 | Y0 | Y1 | | Y3 | | | |
| VB1 | | | Y2 | | Y4 | | |
| VB2 | | | | | | Y5 | |
| VB3 | | | | | | | |

FIG. 6

PLID

| OF | TABLE | HASH | SLOT | KEY | — 651

⇩

PLID

| OF | TABLE | HASH | SLOT | VB UTIL. | — 652

OPTIMIZED HOPSCOTCH MULTIPLE HASH TABLES FOR EFFICIENT MEMORY IN-LINE DEDUPLICATION APPLICATION

CROSS-REFERENCE TO RELATED APPLICATION

The above-referenced application is a continuation application of U.S. patent application Ser. No. 15/161,136, filed May 20, 2016, which claims priority to and the benefit of U.S. Provisional Application 62/314,918, filed on Mar. 29, 2016, the entire content of both of which are incorporated herein by reference.

FIELD

One or more aspects of embodiments according to the present invention relate to data deduplication.

BACKGROUND

Data deduplication, or data duplication elimination, refers to the reduction of redundant data in a memory device to thereby reduce capacity cost of the memory device. In data deduplication, a data object/item (e.g., a data file) is partitioned into one or more lines/chunks/blocks of data. By associating a plurality of the blocks of data consisting of identical data with a single stored block of data, duplicate copies of the blocks of data may be reduced or eliminated by a computer memory, thereby reducing the overall amount of redundant copies of data in the memory device. The reduction of redundant copies of data may increase read latency and memory bandwidth, and may potentially result in power savings.

Accordingly, if duplicated copies of data can be reduced to a single copy of the data, the overall available capacity of the memory device is increased while using the same amount of physical resources. Because the resultant economization of the memory device allows for a reduction in a data rewrite count, and because write requests for duplicated blocks of data that are already stored in the memory may be discarded, a life span of a memory device that implements data deduplication can be prolonged by effectively increasing write endurance.

Conventional methods of data deduplication may use in-memory deduplication technology, whereby a deduplication engine is integrated with a CPU or memory controller (MC) in a CPU-centric approach. Such methods typically implement a deduplicated cache (DDC) that operates with the memory controller to enable the CPU processor's awareness of duplicates, and to attempt to serve deduplicated memory operations (e.g., content lookups, reference count updates, etc.) according to control of the memory controller. Methods of deduplication may also implement a direct translation buffer (DTB), which is a cache for caching translation lines to improve data reads by removing translation fetch from a critical path, and which may be similar to a lookaside buffer.

Deduplication has most commonly been used for hard drives. However, there is interest in providing for fine grain deduplication in the area of volatile memory, such as dynamic random-access memory (DRAM).

The above information disclosed in this Background section is only to enhance the understanding of the background of the invention, and therefore it may contain information that does not constitute prior art.

SUMMARY

Aspects of embodiments of the present disclosure are directed toward memory deduplication in a dynamic random-access memory (DRAM) system.

According to an embodiment of the present invention there is provided a method of memory deduplication, the method including identifying a plurality of hash tables each corresponding to a hash function, and each including physical hash buckets, each physical hash bucket including ways and being configured to store data, identifying a plurality of virtual buckets each including some of the physical hash buckets, and each sharing at least one of the physical hash buckets with another of the virtual buckets, identifying each of the physical hash buckets having data stored thereon as being assigned to a single corresponding one of the virtual buckets, hashing a data line according to a corresponding one of the hash functions to produce a hash value, determining whether a corresponding one of the virtual buckets of a corresponding hash table has available space for a block of data according to the hash value, sequentially moving data from the corresponding one of the virtual buckets to an adjacent one of the virtual buckets when the corresponding one of the virtual buckets does not have available space until the corresponding one of the virtual buckets has space for the block of data, and storing the block of data in the corresponding one of the virtual buckets.

The method may further include updating an address lookup table memory to change one or more lookup addresses corresponding to the moved block of data.

Each of the hash tables further may include a reference count line, a signature line, and a hopword line.

The method may further include generating a hopword vector for indicating which of the physical hash buckets containing data correspond to which of the virtual buckets.

Generating the hopword vector may include, for each of the virtual buckets, using a binary indicator to indicate whether each of the physical hash buckets of a respective one of the virtual buckets contains a block of data in association with the respective one of the virtual buckets.

The method may further include generating a hopword value including $\log 2(H)$ bits per physical hash bucket for indicating which of the physical hash buckets containing data correspond to which of the virtual buckets.

Generating the hopword value may include generating a two-dimensional array including quasi-addresses for each of the physical hash buckets containing data at locations representing associated pairs of the physical hash buckets and the virtual buckets.

The hash table may be stored on a volatile memory.

The volatile memory may include dynamic random-access memory (DRAM).

The method may further include indexing the hash table with a physical line ID (PLID) including a virtual bucket utilization value field of $\log 2(H)$ bits, and including a value equal to a number of data blocks in a corresponding one of the virtual buckets.

The method may further include increasing the virtual bucket utilization value field by one, when writing an object to the corresponding one of the virtual buckets.

The method may further include storing the block of data in a buffer memory when the corresponding hash table is full.

According to an embodiment of the present invention there is provided a deduplication dynamic random-access memory (DRAM) memory module for deduplicating memory by reducing duplicate blocks of data in memory, the deduplication DRAM memory module including a hash table memory for storing deduplicated blocks of data, an address lookup table memory (ALUTM) for storing addresses corresponding to the deduplicated blocks of data, and a processor for receiving read requests to enable the deduplication DRAM memory module to retrieve the blocks of data from the hash table memory and to export the blocks of data, and for receiving write requests to enable the deduplication DRAM memory module to store the blocks of data in the hash table memory.

The hash table memory may include a three-dimensional array of hash tables stored therein, each of the hash tables including physical hash buckets, each physical hash bucket including ways and being configured to store the deduplicated blocks of data.

Each of the hash tables may further include a plurality of virtual buckets each including two or more of the physical hash buckets.

The deduplication DRAM memory module may be configured to move the deduplicated blocks of data between adjacent ones of the virtual buckets within a corresponding one of the hash tables.

The deduplication DRAM memory module may be able to perform data deduplication without externally supplied commands.

The deduplication DRAM memory module may further include a buffer memory for storing data when the hash table memory is full.

According to an embodiment of the present invention there is provided a deduplication DRAM memory module for reducing duplicate blocks of data in memory, the deduplication DRAM memory module including a three-dimensional array of hash tables stored therein, each of the hash tables including physical hash buckets, each physical hash bucket including ways and being configured to store the blocks of data, a processor, and memory, wherein the memory has stored thereon instructions that, when executed by the processor, causes the deduplication DRAM memory module to move a previously stored deduplicated block of data between adjacent virtual buckets of one of the hash tables, each of the virtual buckets including two or more of the physical hash buckets.

The memory may have further stored thereon instructions that, when executed by the processor, causes the deduplication DRAM memory module to store incoming data in one of the virtual buckets from which the previously stored deduplicated block of data was moved.

BRIEF DESCRIPTION OF THE DRAWINGS

These and other aspects of the present invention will be appreciated and understood with reference to the specification, claims, and appended drawings wherein:

FIGS. 5A, 5B, and 5C depict two-dimensional arrays for generating hopwords to associate virtual buckets with particular physical buckets according to embodiments of the present invention;

FIG. 6 is block diagram of a physical line ID (PLID) for addressing blocks of data in the hash table memory according to an embodiment of the present invention;

DETAILED DESCRIPTION

Figure 1:
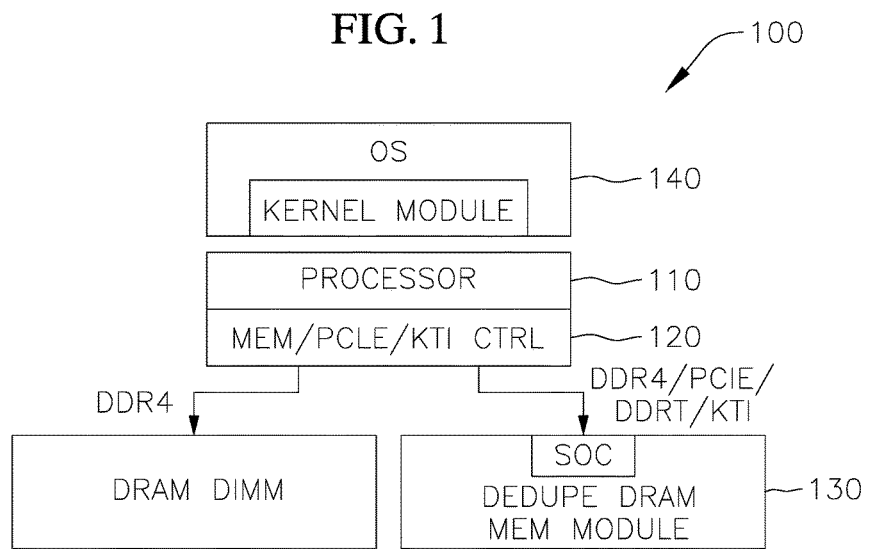
FIG. 1 is a block diagram of a deduplication DRAM system architecture of an embodiment of the present invention.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of a deduplication DRAM system architecture of an embodiment of the present invention.

Referring to FIG. 1, to function as computer memory, deduplicated memory performs a function known as "translation" to record a relationship between content of the original data and a set of unique memory blocks that have been deduplicated, the recorded relationship being memorized in a compressed form. For example, addresses of the original data may be stored in a lookup table.

Typically, a processor 110 of the CPU lacks direct access to physical memory (e.g., a deduplication DRAM memory module 130), which is instead managed by a memory controller 120 as an array of memory lines. CPU-centric deduplication systems seek to cache data inside the CPU before the data reaches the memory system.

The deduplication DRAM system architecture 100 of the present embodiment uses memory-centric deduplication, as opposed to conventional CPU-centric deduplication, meaning that the deduplication DRAM memory module 130 may perform memory deduplication in the absence of commands from the processor 110. The deduplication DRAM system architecture 100 also uses a configurable deduplication algorithm stored in the deduplication DRAM memory module 130 to increase the capacity benefit of the memory, to thereby provide a large capacity memory solution. That is, unlike CPU-centric deduplication, the deduplication DRAM system architecture 100 of the present embodiment has all of the deduplication intelligence included within a RAM module (e.g., the deduplication DRAM memory module 130). Accordingly, deduplication is able to be performed within the deduplication DRAM memory module 130 unbeknownst to the CPU module 140, thereby allowing a capacity of the DRAM memory module 130 to be increased. That is, because the deduplication is in the fine grain, and operates within volatile memory (e.g., within the DRAM memory module 130), all of the deduplication intelligence of the present embodiment occurs within the RAM module 130 itself, while the kernel module 140 in the CPU may be unaware of the specifics of the deduplication operations performed within the DRAM module 130.

It should be understood that, although the present embodiment describes using DRAM as the memory module 130, other types of memory may be used in other embodiments of the present invention. Furthermore, the deduplication DRAM system architecture 100 of the present embodiment is able to support interfacing with multiple types of memory.

That is, the Deduplication DRAM memory module 130 of the present embodiment is able to be associated with multiple different types of memory interfaces through the memory controller 120 (e.g. double data rate fourth-generation synchronous dynamic random-access memory (DDR4), Peripheral Component Interconnect Express (PCIe), which is a serial expansion bus standard for connecting a computer to one or more peripheral devices, DDR-T, and KTI). Accordingly, it should be noted that different architectures may be used to integrate the deduplication DRAM memory module 130 into the deduplication DRAM system architecture 100.

Also, although some changes may be made to an existing DRAM memory module to implement the present embodiment (e.g., a driver upgrade), software implementation allows the use of the deduplication DRAM system architecture 100 of the present embodiment without making physical changes to the operating system/CPU module 140 or the processor 110.

The deduplication DRAM system architecture 100 of the present embodiment may implement a system on a chip (SoC) on the deduplication DRAM memory module 130 for DRAM intelligent protocols, such as deduplication, content addressability, security, processing-in-memory (PIM), row address strobe (RAS), which is a signal sent to a DRAM that tells the DRAM that an associated address is a row address, whereby a data bit in DRAM is stored in a cell located by the intersection of a column address and a row address, etc.

The deduplication DRAM system architecture 100 may also have a smart system software that causes the processor 110 to allow for virtual density management, smart data placement, and DRAM intelligent Application Programming Interfaces (APIs), etc. in connection with the memory controller 120.

The DRAM memory module 130 may further have 3DS DRAM components, such as a high capacity DRAM memory module in multiple form factors (e.g., dual in-line memory module (DIMM), 2.5 In, full height, half length (FHHL), half height half length (HHHL), full height full length (FHFL), etc.

Accordingly, by providing a memory-centric deduplication system using the deduplication DRAM system architecture 100 of the present embodiment, a deduplicate write process may be performed directly at a memory interface, thereby increasing the capacity of the DRAM 130.

Figure 2:
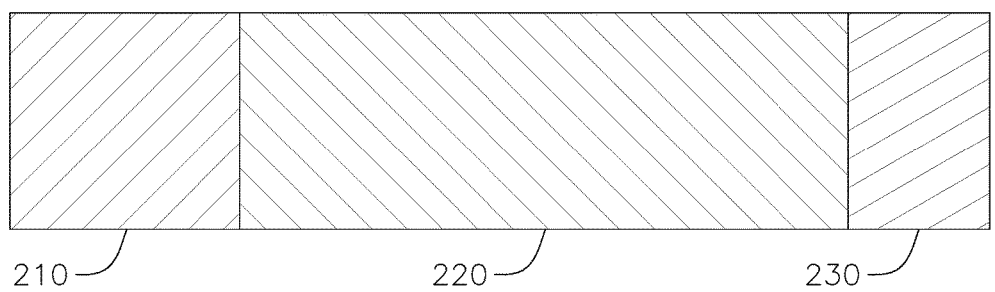
FIG. 2 is a block diagram of the types of memory in a deduplication DRAM memory module of the embodiment of FIG. 1.
Figure 3:
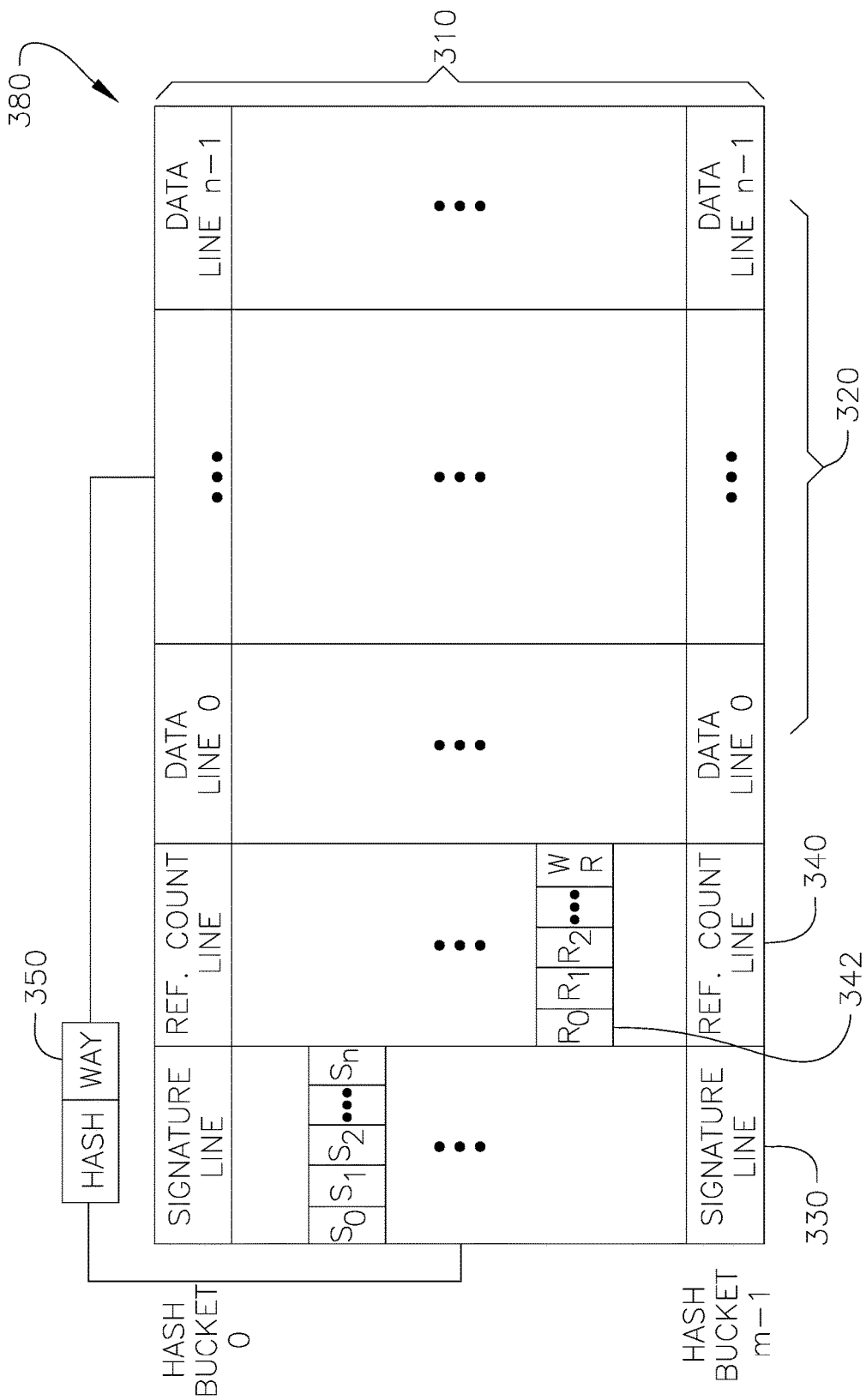
FIG. 3 is a block diagram of a hash table of a hash table memory of the embodiment of FIG. 2.

FIG. 2 is a block diagram of the types of memory in a deduplication DRAM memory module of the embodiment of FIG. 1, and FIG. 3 is a block diagram of a hash table of a hash table memory of the embodiment of FIG. 2.

Referring to FIG. 2, the deduplication DRAM memory module of an embodiment of the present invention may have a deduplication algorithm architecture wherein a memory space inside the DRAM memory module 130 is categorized into three different regions. The three different regions include an address lookup table (LUT) memory (ALUTM) 210 for indicating locations of stored deduplicated blocks of data, a hash table memory 220 for storing the deduplicated blocks of data, and an overflow/buffer memory 230 for storing data when hash ways of a hash table of the hash table memory are full.

When a block of data is to be entered into the deduplication DRAM memory module 130, the deduplication algorithm may operate to determine whether the block of data is a new, previously unstored block of data that lacks any corresponding address in the ALUTM 210. To perform this operation, the deduplication algorithm will access the ALUTM 210. To ensure that identical blocks of data are stored as only a single entry, a pointer (e.g., a physical line ID (PLID), which is described further below with respect to FIG. 5) within the ALUTM 210 indicates where in the hash table memory 220 the identical block of data is stored. That is, the ALUTM 210 is a storage device for associating locations (e.g., addresses) within a hash table with a lookup address mapping pointer (e.g., a PLID). Accordingly, if the block of data has been previously stored in the hash table memory 220, the pointer within the ALUTM 210 is able to point to an address of the hash table memory 220 in which the identical block of data is stored, thereby obviating the need to store a duplicate copy of the block of data, thereby increasing memory capacity of the DRAM memory module 130.

Referring to FIG. 3, memory deduplication may use a relatively efficient yet simple multiple-way hash table/hash array 380, to ensure a high level of deduplication, and correspondingly, a large memory capacity of the DRAM memory module 130. The hash table memory 220 of the DRAM memory module 130 of the present embodiment is where one or more hash tables 380 sit, and is used for its usefulness in determining whether a block of data is unique. The hash table 380 may be thought of as two-dimensional array comprising hash buckets 310 (rows) and hash ways 320 (columns). That is, the hash table 380 of the present embodiment includes m rows of hash buckets 310, each hash bucket 310 containing n columns of data lines/slots/entries/ hash ways 320 that indicate a capacity of the hash bucket 310 (m and n being integers).

The blocks of data are stored in the hash ways 320 of the hash table memory 220, and the address pointers in the ALUTM 210 may store values indicating a particular hash bucket 310 and a particular hash way 320 associated with a particular block of data. Accordingly, the address (e.g., a 64-bit address) may be indexed into the ALUTM 210, and from that, an associated hash way 320 of a hash bucket 310 of a hash table 380, which stores a block of data corresponding to the address, may be determined.

Accordingly, during a write process (e.g., a 64-byte data write), upon receiving a write request (i.e., a request to record incoming data comprising one or more blocks of data), a hash value is calculated for the incoming data using a hash function/hash algorithm (i.e., the incoming data is "hashed") so that a corresponding hash bucket 310 and way 320 can be determined. Accordingly, the hash value indicates where the block of data is to be placed, or, when the block of data (e.g., a 64-byte block of data) is a duplicate, the hash value indicates where the block of data is already stored in the hash table memory 220. As data content is added to memory, some of the m hash buckets 310 may reach capacity first. Accordingly, the deduplicated DRAM memory module 130 includes an overflow provision that uses the buffer memory 230 for storing blocks of data that cannot be entered into the hash table memory 220. Thereafter, an original lookup address can be retrieved, and the ALUTM 210 can be updated in accordance with the lookup address calculated from hashing the incoming data.

The buffer memory 230 may be used when, during an attempted write process, it is determined that all of the hash ways 320 are full. That is, when the hash table 380 fills up, data can be placed in a non-deduplicated overflow region of the buffer memory 230, thereby reducing deduplication levels. Accordingly, the buffer memory 230 is essentially a reserved, standard, simple overflow memory region, which serves as an SOC memory buffer/cache for implementing virtual density over-provision management overflow. Once data is placed in the buffer memory 230, it is no longer hashed, and can no longer be deduplicated.

If a computer application seeks to store an identical sequence of values to memory multiple times, then multiple entries in a translation array stored in the ALUTM 210 refer to the same address in which a block of data stored in the hash table memory 220, wherein the entries in the ALUTM 210 are smaller than the original unique blocks of data, thereby allowing for efficient compression to be achieved.

Each of the m hash buckets 310 may further include a reference/frequency count line 340 including a unique identifier for indicating the corresponding hash way 320 of the hash bucket 310, and a signature line 330. For each hash bucket 310, the corresponding signature line 330 contains either a zero to indicate a free line, or a non-zero secondary hash value for content lookup optimization. Accordingly, for content lookup, there is typically either no signature match requiring a free line to be allocated based on a zero entry in the signature line, or a single signature match exists such that a subsequent read of the data line and comparison of the content confirms the existence of a duplicate. Each of the m hash buckets 310 may further include a hopword line 370, which will be described further with reference to FIGS. 5A, 5B, and 5C below.

A physical line ID (PLID) 350 may be used to index data into the hash table 380. The PLID 350 may be used to identify memory lines, which may be compartmentalized into one of the ALUTM 210, the hash table memory 220, or the buffer memory 230. Each memory line may be referred to as either a data line for storing unique content in the hash table 380, or a translation line for storing several PLIDs 350 and for providing a mapping from a processor bus address to a deduplicated block of data in the hash table 380. That is, a bus address identifies a translation line, and further identifies an entry in the translation line containing a relevant PLID 350, which in turns specifies the particular data line. Accordingly, the PLID 350 may be implemented to include an overflow flag, and may include data for indicating a particular corresponding hash table 380, corresponding hash bucket bits, and corresponding way bits indicating a location of the data block corresponding to the PLID 350.

For each hash bucket 310, there is one associated hash function/hash algorithm "h(x)," which is an algorithm that produces a log 2(m)-bit hash that is used to index data into the hash buckets 310 (e.g., if the hash table 380 has 8 physical hash buckets 310, then the hash function of that hash table 380 will produce a 3-bit hash). That is, the hash function h(x) allows a relatively large amount of input data (e.g., an input data file to be stored in memory) to be input into the hash function h(x), and a substantially different smaller amount of output data (e.g., the hash value) is generated and output by the hash function h(x) to be stored in the hash table 380. Accordingly, the hash function h(x) enables compression, as different data sets may occasionally hash to a same hash value.

In writing to deduplicated memory, upon receiving a write request corresponding to a data file, the deduplicated memory first performs a duplicate search to determine whether an identical/duplicate block of data has already been stored in the hash table 380. The deduplicated memory then updates the entries in the ALUTM 210 and the hash table memory 220. For example, the reference/frequency count line 340 may be updated by updating a frequency count of the original lookup address (i.e., decreased by 1) in the hash table memory 220, and where the corresponding block of data is deleted when the frequency count reaches 0. Furthermore, a new PLID 350 may be generated in the ALUTM 210.

During the duplicate search, which may be referred to as content lookup, the deduplication DRAM memory module 130 seeks pre-existing instances of the data file, or of a portion thereof, that is intended to be written. When there is a pre-existing instance of the data stored in the hash table memory 220, the duplicate search returns a PLID 350 that points to a corresponding data line. When no pre-existing instance of the data is found, then a new data line is created for the corresponding block of data by allocating space in the hash table 380, writing the content therein, and returning a new PLID 350. The content may be recorded by storing the PLID 350 in the ALUTM 210 at an offset determined by the bus address.

To insert a line of data "C" into the hash table 380, the corresponding hash function of C "h(C)" may be computed as a mathematical operation. Once the hash function is computed for the line of data C, the row of the hash table T(h(C)) may be checked by a content lookup operation to see if there is sufficient available space to allow of the insertion of the line of data C (or to see if a duplicate of the line of data C is already in the hash table 380).

As mentioned, each hash bucket 310 of the hash table 380 additionally includes a signature line 330 and a reference count line 340, each of which occupying only a single hash way 320 due to the fact that signatures 332 of the signature line 330 and reference counts 342 of the reference count line 340 may be designed to be small enough to pack several quantities into each hash bucket 310. That is, in the hash table 380, one entire column of the hash table 380 may be assigned to signature lines 330 respectively belonging to the hash buckets 310, and one entire column may be assigned to the reference count lines 340 respectively belonging to the hash buckets 310.

As blocks of real data, such as the line of data "C," are added to the hash table 380, the hash table 380 begins to be filled with data that may later be accessed by matching a corresponding PLID 350 stored in the ALUTM 210 to an address within the hash table 380 of each individual deduplicated line of data. The address within the hash table 380 may be identified by identifying the particular hash bucket 310 and particular hash way 320 in which the data is located (e.g., identifying a row and column of the hash table 380). Accordingly, for each block of data stored in the hash table 380, there are one or more corresponding addresses that are identified by a corresponding PLID(s) 350, that are stored in the ALUTM 210, and that point to the location of the block of data. Once the hash table 380 is filled up with data, newly introduced data is placed in the non-deduplicated overflow region/buffer memory 230, thereby reducing deduplication levels.

In reading from deduplicated memory, the deduplicated memory returns a copy of either the data line from the hash table memory 220 or an overflow line from the buffer memory 230. For example, when the stored data is to be read from, upon receiving a read request, the corresponding addresses of the hash table 380 are looked up using PLIDs 350 stored in the ALUTM 210. Then, the corresponding blocks in each address are retrieved and reassembled.

Figure 4:
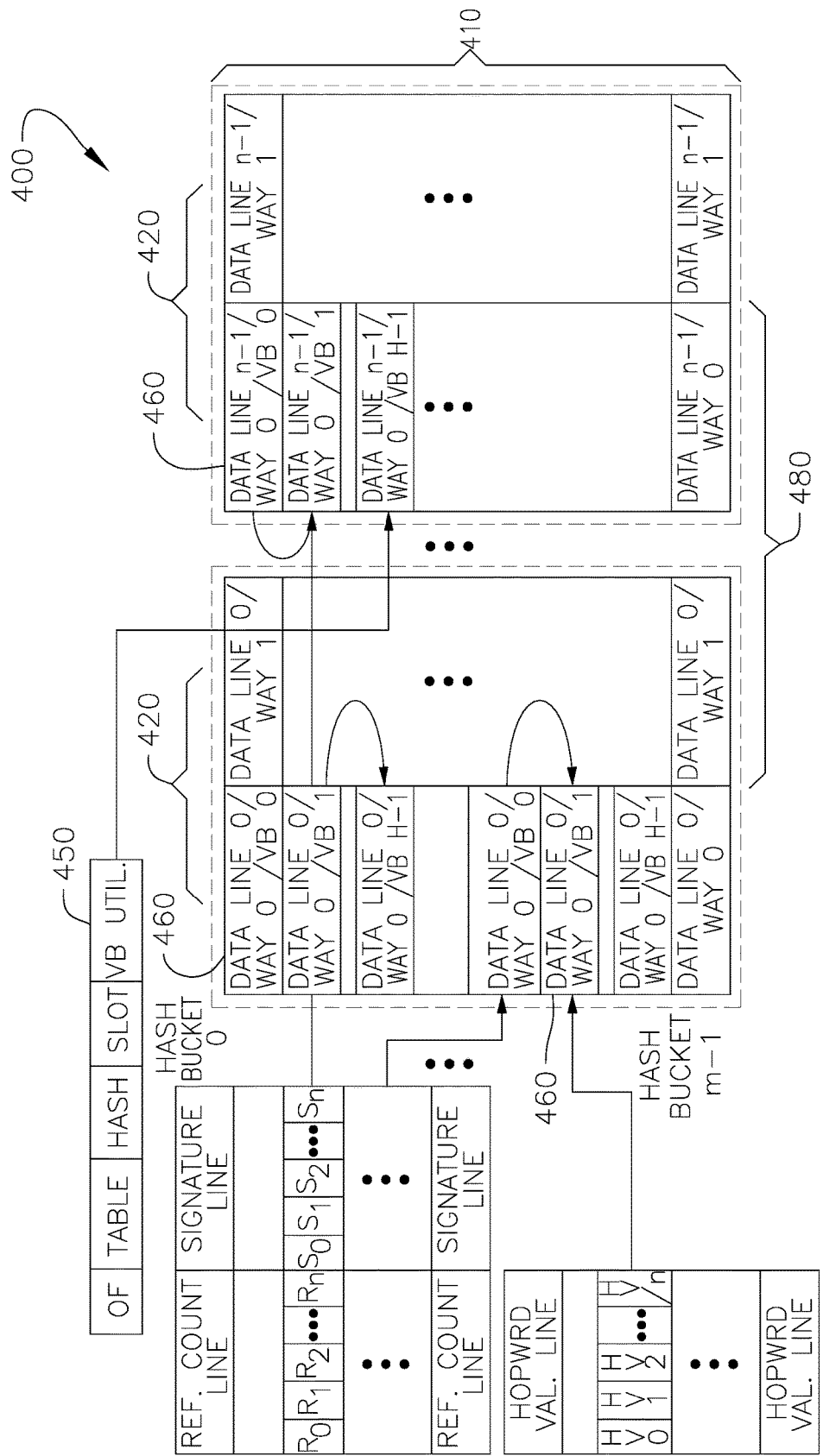
FIG. 4 is block diagram of a multiple hash table array according to an embodiment of the present invention.

FIG. 4 is block diagram of a multiple hash table array according to an embodiment of the present invention.

Referring to FIG. 4, a deduplication DRAM system according to an embodiment of the present invention uses a hash table array 400 comprising multiple hash tables (MHT) 480, each of which including m hash buckets 410, each hash bucket 410 including n hash ways 420. Although the present embodiment describes the hash tables 480 and the hash buckets 410 as being uniform with respect to their dimensions (e.g., m and n are described as integers), in other embodiments, different hash tables in the same multiple hash table array may have different numbers of buckets, and similarly, different hash buckets within the multiple hash table array, or even within a same hash table, may have different numbers of ways. Furthermore, although the multiple hash tables 480 are collectively utilized, the different hash tables 480 are, in some regards, independent of one another (e.g., the different hash tables 480 may have different respective hash functions, or may have a common hash function).

If the array 400 of hash tables includes "k" parallel hash tables $T_1, T_2, \ldots, T_k$, (k being an integer), where each hash table 480 uses a separate, independent hash function $h_1(x)$, $h_2(x), \ldots, h_k(x)$, respectively, because each of the hash tables $T_1, T_2, \ldots, T_k$ contains m hash buckets 410, such that the hash functions $h_1(x), h_2(x), \ldots, h_k(x)$ still produce log m-bit hashes, and because each physical bucket 410 contains n hash ways 420, the capacity of the 3-dimensional (3D) hash table array (e.g., an array of multiple hash tables) is m×n×k.

Each hash table 480 may correspond to a single hash function, which determines how data is indexed. By hashing incoming data to be written, the resulting calculation (e.g., a hash value including a lookup address and key) can be compared with a key and with a value, and if the value is matched, a frequency/reference count line 340 in the corresponding hash bucket 410 is increased, thereby indicating that an additional PLID 350 in the ALUTM 210 points to the particular line.

Unlike conventional hash tables, the multiple hash tables 480 of the present embodiment each include a plurality of virtual hash buckets/virtual buckets 460, the virtual buckets 460 being made of a plurality of physical hash buckets/physical buckets 410. Hereinafter, the term "physical bucket" will refer to the previously discussed hash buckets, and will be used to distinguish the previously discussed hash buckets 310 from the virtual buckets 460.

Each virtual bucket 460 may include H of the m physical buckets 410 of the corresponding hash table 480, H being an integer that is less than m. However, it should be noted that different ones of the virtual buckets 460 in a same hash table 480 may share one or more physical buckets 410. As will be described below, by using virtual buckets 460 according to embodiments of the present invention, a fourth dimension is added to the 3-dimensional multiple-hash table array. Accordingly, greater flexibility in arranging and placing data may be provided, thereby increasing efficiency and increasing a compression ratio of the deduplication DRAM system.

The present embodiment uses virtual buckets 460 to increase another level of data placement flexibility, as a block of data stored in one of the hash tables 480 may be moved within a corresponding virtual bucket 460, or to a different physical bucket 410, to free up other physical buckets 410 shared by other virtual buckets 460. By freeing up space within the hash table 480, deduplication may be achieved by removing obsolete/duplicated data. That is, by use of the virtual buckets 460 according to embodiments of the present invention, there is no strict limitation caused by hashing a line of data using a hash function to a restricted corresponding location, and data is able to be placed in a "near-location" hash bucket 410, which refers to a physical bucket 410 that is within the same virtual bucket 460 that includes the initially intended (but occupied) physical hash bucket 410.

As an example, content (e.g., the line of data C) is to be placed into one of physical buckets 410 of one of the k hash tables $T_1(h_1(C)), T_2(h_2(C)), \ldots, T_k(h_k(C))$. If the line of data C is to be placed into $T_1(h_1(C))$, instead of requiring the line of data C to be placed in the physical bucket 410 represented by $T_1(h_1(C))$, the present embodiment allows for a virtual bucket 460 that is larger than a single physical bucket 410, and that includes the physical bucket 410 represented by $T_1(h_1(C))$, but also contains H total physical buckets 410. That is, the virtual bucket 460 contains an aggregate of H contiguous, or adjacent, physical buckets 410 aligned within a hash table 480 and including $T_1(h_1(C))$, $T_1(h_1(C)+1)$, $T_1(h_1(C)+2), \ldots, T_1(h_1(C)+H-1)$.

Accordingly, the virtual buckets 460 allow blocks of data to be moved within the hash table 480 to free up spaces for future write operations. An operation of the present embodiment that allows movement of blocks of data that were previously entered into a hash table 480 (within virtual buckets 460 containing physical buckets 410 of the hash table 480) may be referred to as hopscotch. The operation of hopscotch using multiple hash tables 480 for memory deduplication may be improved as described below.

First, the DRAM memory module 130 may attempt to insert a line of data C into a hash table 480 as a result of a hash function of the hash table 480. However, sometimes a different line of data may be previously entered into the hash table 480 as a result of the same hash function. That is, different lines of data, despite being different, may be directed to a same location within the hash table 480 as a result of the hash function. To determine where the line of data C should be inserted, the operation may first look for a first available physical bucket 410 at or following the physical bucket 410 represented as T(h(C)).

Accordingly, in determining where to write the line of data C, because the initially intended physical bucket 410 represented as T(h(C)) may be occupied, the first available physical bucket 410 (i.e., the first empty space into which the line of data may be inserted) may be represented as T(h(C)+f), where f is 0 or more. Assuming that the physical bucket 410 that is represented as T(h(C)) is the first physical bucket 410 of H physical buckets 410 of a corresponding virtual bucket 460, if f is less than H (i.e., if there exists an unoccupied physical bucket 410 within the same virtual bucket 460), then C can be placed into the corresponding virtual bucket 460. Similarly, if the physical bucket 410 that is represented as T(h(C)) is the second physical bucket of the corresponding virtual bucket 460, if f is less than H−1, then C can be placed into the corresponding virtual bucket 460.

However, and assuming the first physical bucket 410 of the corresponding virtual bucket 460 is the intended physical bucket 410, if f is greater than, or equal to, H (i.e., there is no physical bucket 410 of the virtual bucket 460 into which C can fit), even though C does not fit into its virtual bucket 460, the operation can attempt to create an empty space in the virtual bucket 460 in the following way. For example, the deduplication DRAM memory module 130 of an embodiment of the present invention may look at the physical buckets 410 starting with the physical bucket 410 represented by T(h(C)+f−H), then the physical bucket represented by T(h(C)+f−H+1), and so on until determining whether the physical bucket 410 represented by T(h(C)+f−1) has data included therein (e.g., may scan the virtual bucket 460 from head to tail). The deduplication DRAM memory module may then determine whether any data object contained in the physical buckets 410 from T(h(C)+f−H) to T(h(C)+f−1) can be placed into the empty space T(h(C)+f). That is, the deduplication DRAM memory module may determine whether any of the physical buckets from T(h(C)+f−H) to T(h(C)+f−1) is in a common virtual bucket 460 with the physical bucket T(h(C)+f), thereby allowing data contained therein to be moved. The deduplication DRAM memory module may then place the earliest such data object found in the empty space to thereby create a new empty space in a physical bucket 410 represented by T(h(C)+e) (e being an integer that is less than f). This process may be repeated until e is less than H (e.g., data may be moved within the hash table in a cascading fashion), thereby freeing up enough space to allow placement of the data line C in the corresponding virtual bucket 460.

For example, and referring to FIG. 5B, in the present example, we will assign physical bucket PB2 as the intended physical bucket 410. Because the intended physical bucket PB2 is occupied in association with virtual bucket VB1, virtual bucket VB2 may be scanned from head to tail (e.g., from physical bucket PB2 to physical bucket PB5). Because physical buckets PB3, PB4, and PB5 are also occupied, the first available physical bucket 410 is physical bucket PB6 (i.e., f is equal to 4, and is therefore greater than or equal to H, and the first available physical bucket 410 is not in the corresponding virtual bucket VB2). Accordingly, the data in physical bucket PB5 may be moved to physical bucket PB6, thereby freeing up space in virtual bucket VB2, such that the data line C may be placed in the corresponding virtual bucket VB2 (in physical bucket PB5). If, however, the intended physical bucket was PB1 (i.e., the corresponding virtual bucket 460 was VB1), the process could be repeated such that the data in physical bucket PB4 could be moved from virtual bucket VB1 to adjacent virtual bucket VB2 into the newly freed up space of physical bucket PB5. Thereafter, the data line C could be written in physical bucket PB4 of the virtual bucket VB1 corresponding to the intended physical bucket of PB1.

Accordingly, because of the common ownership of certain physical buckets 410 by different virtual buckets 460, which may be thought of as overlap of different virtual buckets 460, data can be moved from one virtual bucket 460 to another virtual bucket 460, thereby creating space for the initial hash bucket 410.

In another embodiment, during a write process, upon receiving a request to write a block of data to the array 400 of hash tables, the DRAM memory module 130 may look up an entire virtual bucket 460 of each hash table's worth of data to check whether the existing item is already in one of the hash tables 480. If a first intended hash table 480 is full, and if the block of data is not found in the first intended hash table 480 (i.e., each way 420 of each physical bucket 410 is occupied by a different block of data), then the DRAM memory module 130 may seek to enter the data into another hash table 480 of the array 400. However, if all of the hash tables 480 of the multiple hash table array 400 are full, then the block of data would "spill over" to the buffer memory 230. In such an embodiment, movement of data within the hash table array 400 may be disallowed by the DRAM memory module 130.

FIGS. 5A, 5B, and 5C depict two-dimensional arrays for generating hopwords to associate virtual buckets with particular physical buckets according to embodiments of the present invention.

Referring to FIGS. 5A, 5B, and 5C, according to the present embodiment, the various virtual buckets 460 may be associated with their corresponding physical buckets 410 by using either a hopword value 591 or a hopword vector 592, and by using a virtual bucket utilization value to efficiently track the data movement. Because each occupied physical bucket 410 can only correspond to a single virtual bucket 460, the hopword value 591 or hopword vector 592 may be used to track which virtual bucket 460 corresponds to each occupied physical bucket 410.

In the present example four virtual buckets VB0, VB1, VB2, and VB3 each have a different set of four contiguous physical buckets from the group of physical buckets PB0, PB1, PB2, PB3, PB4, PB5, and PB6 (i.e., H is equal to 4).

For example, referring to FIGS. 5A and 5B, the hopword vector 592 may be determined by creating a two-dimensional array comprising of physical bucket locations and virtual bucket locations (e.g., quasi-addresses), and by placing a 1 (e.g., a binary indicator) in each physical bucket 410 containing data for each virtual bucket 460, noting that no more than a single 1 may be in any column corresponding to the physical buckets 410. Accordingly, the hopword vector 592 may include an array of 1s and 0s that can be used to track physical bucket usage for each virtual bucket 460. In the present example, physical buckets PB0, PB1, and PB3 are occupied for the first virtual bucket VB0, physical buckets PB2 and PB4 are occupied for the second virtual bucket VB1, only physical bucket PB5 is occupied for third virtual bucket VB2, and the fourth virtual bucket VB3 is unoccupied.

Similarly, and referring to FIG. 5C, a hopword value 591 may be created based on the occupied physical buckets 410 by knowing which virtual buckets 460 correspond thereto. The hopword value may be log 2(H) bits long (H being the number of physical hash buckets 410 per virtual bucket 460).

Information of the hopword vector 592 or hopword value 591 may be stored in a hopword line 470 for each hash bucket 410, such that the relationship between physical buckets 410 and virtual buckets 460 can be indexed in memory.

FIG. 6 is block diagram of a physical line ID (PLID) for addressing blocks of data in the hash table memory according to an embodiment of the present invention.

Referring to FIG. 6, in accordance with an embodiment of the present invention, a modified PLID 650 is provided. A PLID 650 of an embodiment of the present invention includes a plurality of bits respectively indicating an address, offsets, an index of the table, the hash, and the slot/way, and a key 651 that is paired with a specific virtual bucket 460 to track objects moved between virtual buckets 460. Accordingly, if the key 651 matches with a specific virtual bucket 460, that specific virtual bucket 460 may have a data object written thereto.

In another embodiment, however, the PLID 650 replaces the key 651 with a virtual bucket utilization value field 652 (e.g., a virtual bucket index) comprising log 2(H) bits (e.g., a virtual bucket having a height of 16 physical buckets would correspond to a 4-bit virtual bucket utilization value field in the PLID 650). The virtual bucket utilization value field 652 indicates which virtual bucket 460 corresponds to each occupied physical bucket 410. Accordingly, when writing a data object to a virtual bucket 460, a number of objects already present in the virtual bucket 460 may be computed, and a value p, which is equal to the number of items already in the virtual bucket plus one, may be written as the virtual bucket utilization value 652. By using the virtual bucket utilization value 652 in the PLID 650, the storage overhead of the PLID 650 may be reduced.

Figure 7:
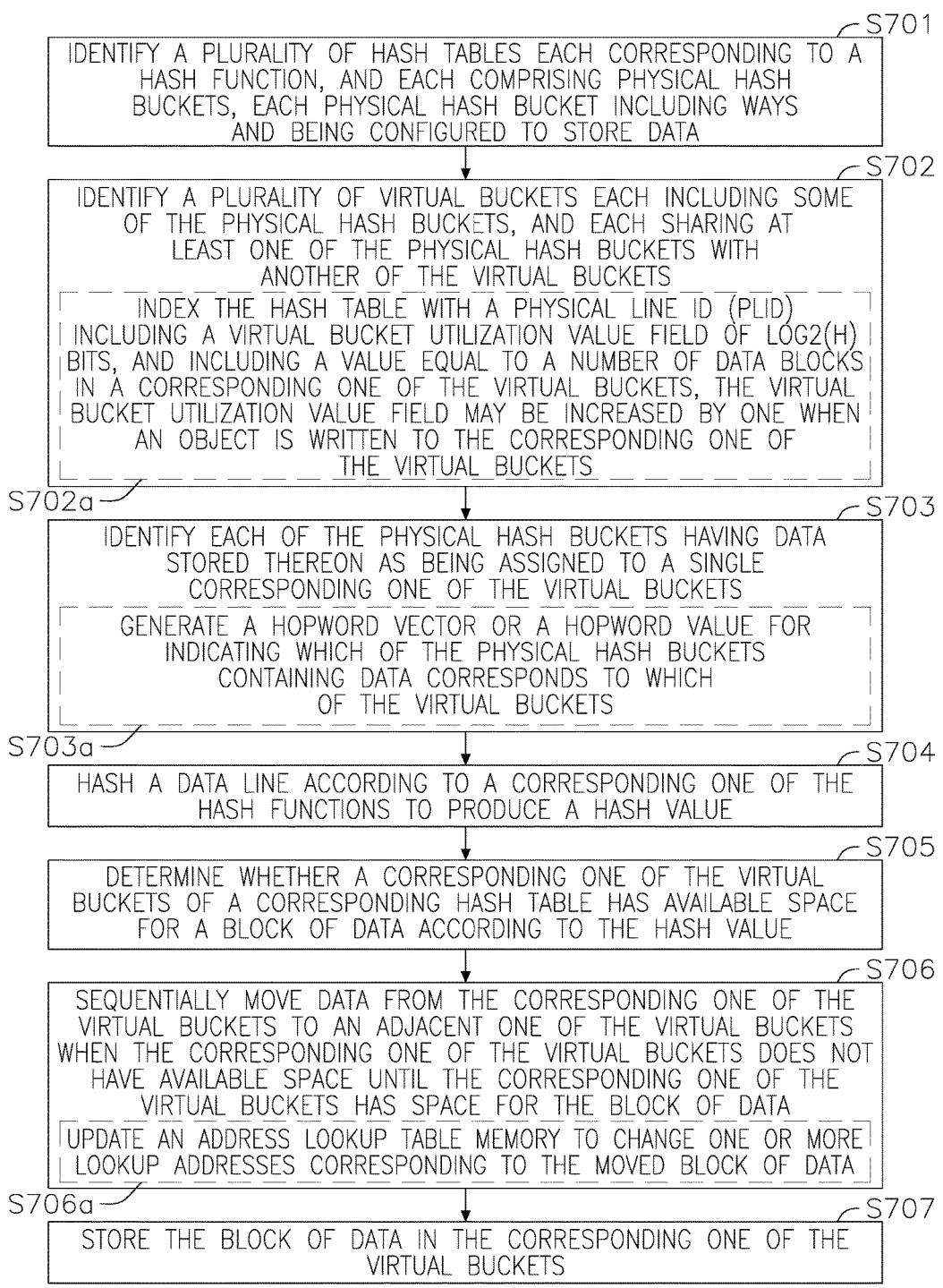
FIG. 7 is a flow chart illustrating a process for writing data into a multiple hash table array of a memory module using a hopscotch method, according to an embodiment of the present invention.

FIG. 7 is a flow chart illustrating a process for writing data into a multiple hash table array of a memory module using a hopscotch method, according to an embodiment of the present invention.

Referring to FIG. 7, at operation S701, a plurality of hash tables may be identified, each of the hash tables corresponding to a hash function, and each including physical hash buckets, each physical hash bucket including ways and being configured to store data (e.g., the deduplication DRAM memory module 130 may identify k hash tables 480, each corresponding to a hash function h(x), each including m physical hash buckets 410, each physical hash bucket including n ways 420).

At operation S702 a plurality of virtual buckets may be identified, each of the virtual buckets including some of the physical hash buckets, and each sharing at least one physical hash bucket with another virtual bucket (e.g., the deduplication DRAM memory module 130 may identify a plurality of virtual buckets 460, each of the virtual buckets 460 including H of the m physical hash buckets 410, and each virtual bucket 460 sharing at least one of the physical hash buckets 410 with another virtual bucket 460, as shown in FIG. 4). The plurality of virtual buckets may be identified at operation S702a by indexing the hash table with a physical line id (PLID) including a virtual bucket utilization value field of log 2(h) bits, and including a value equal to a number of data blocks in a corresponding one of the virtual buckets, and by increasing the virtual bucket utilization value field by one when an object is written to the corresponding one of the virtual buckets (e.g., the virtual buckets 460 may be identified by indexing the hash table 480 with a physical line ID (PLID) 650 including a virtual bucket utilization value field 652, and including a value equal to a number of data blocks in a corresponding one of the virtual buckets 460, as shown in FIG. 6, wherein the virtual bucket utilization value field 652 may be increased by one when an object or data block is written to the corresponding one of the virtual buckets 460).

At operation S703, each of the physical hash buckets having data stored thereon may be identified as being assigned to a single corresponding one of the virtual buckets (e.g., the deduplication DRAM memory module 130 may identify the physical hash buckets 410 having data stored thereon (PB0, PB1, PB2, PB3, PB4, and PB5) as being assigned to a single corresponding one of the virtual buckets 460 (VB0, VB1, and VB2) as shown in FIGS. 5B and 5C). At operation S703a, the physical hash buckets may be identified by generating a hopword vector or a hopword value for indicating which of the physical hash buckets containing data correspond to which of the virtual buckets (e.g., the deduplication DRAM memory module 130 may generate a hopword vector 592 or a hopword value 591 for indicating which of the physical hash buckets 410 that contain data correspond to which of the virtual buckets 460, as shown in FIGS. 5B and 5C).

At operation S704, a data line may be hashed according to a corresponding one of the hash functions to produce a hash value (e.g., the deduplication DRAM memory module 130 may receive a write request from the memory controller 120 corresponding to a data line C, and may hash the incoming data according to a corresponding one of the hash functions h(x) to produce a hash value).

At operation S705, whether a corresponding one of the virtual buckets of a corresponding hash table has available space for a block of data according to the hash value may be determined (e.g., the deduplication DRAM memory module 130 may determine that virtual bucket 460 VB3 has space in physical bucket PB6 for a block of data, as shown in FIGS. 5B and 5C).

At operation S706, data may be sequentially moved from the corresponding one of the virtual buckets to an adjacent one of the virtual buckets when the corresponding one of the virtual buckets does not have available space until the corresponding one of the virtual buckets has space for the block of data (e.g., the deduplication DRAM memory module 130 may sequentially move data from physical bucket PB5 of virtual bucket VB2 to virtual bucket VB3 when virtual bucket VB2 does not have any other available physical buckets until virtual bucket VB2 has space for the block of data, as shown in FIGS. 5B and 5C, wherein the process may be repeated to move data from physical bucket PB4 of virtual bucket VB1 to physical bucket PB5 of virtual bucket VB2, if virtual bucket VB1 is the corresponding one of the virtual buckets 460). At operation S706a, an address lookup table memory may be updated to change one or more lookup addresses corresponding to the moved block of data (e.g., the deduplication DRAM memory module 130 may update the ALUTM 210 to change one or more address pointers corresponding to the moved block of data such that the new address of the moved block of data in the hash table memory 220 can be retrieved).

At operation S707, the block of data may be stored in the corresponding one of the virtual buckets (e.g., the deduplication DRAM memory module 130 may store the block of data in physical bucket PB4 of virtual bucket VB1 if virtual bucket VB1 is the intended virtual bucket 460, as shown in FIGS. 5B and 5C). If it is determined that the hash table 480 including virtual bucket VB1 is full, the block of data may be stored in the buffer memory 230.

Figure 8:
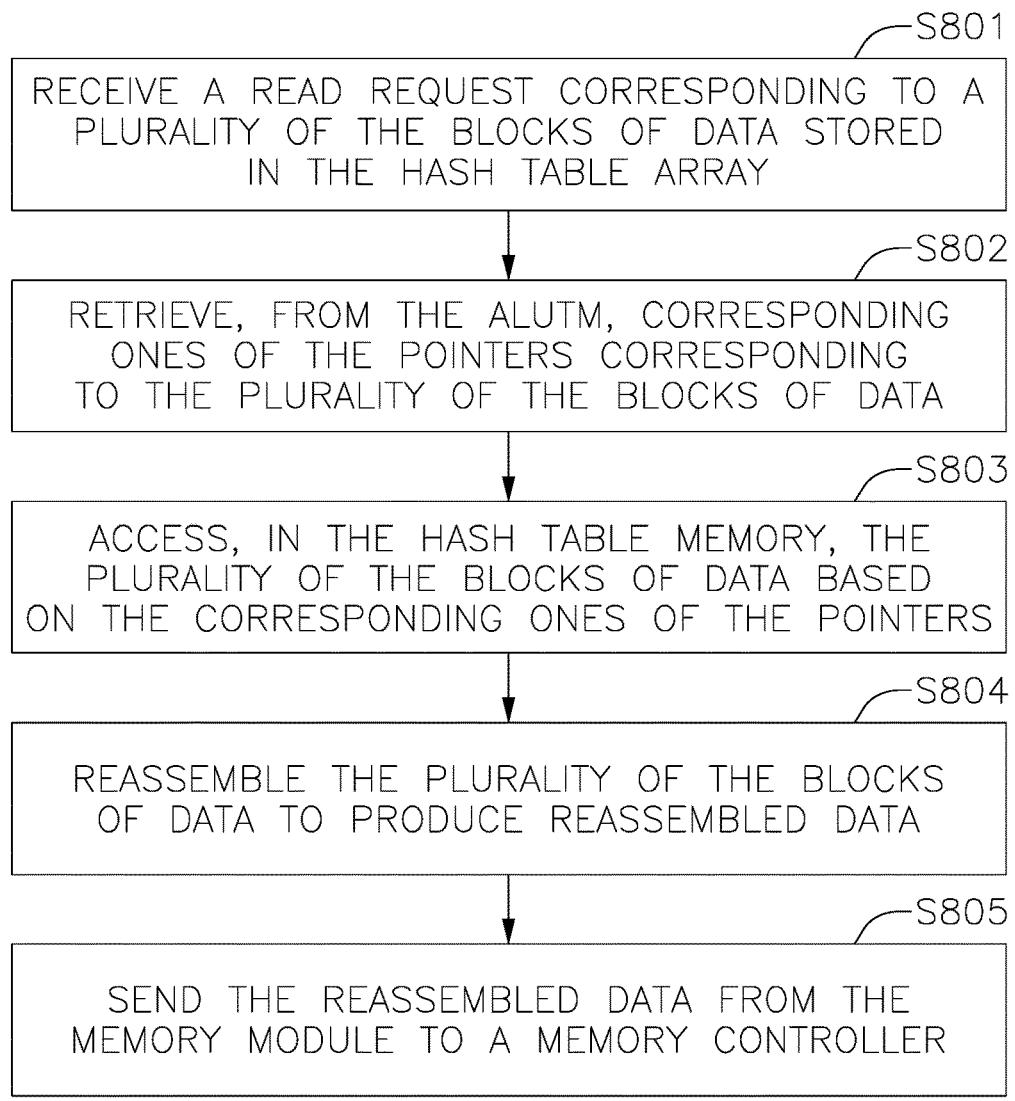
FIG. 8 is a flow chart illustrating a process for reading data from a multiple hash table array of a memory module, according to an embodiment of the present invention.

FIG. 8 is a flow chart illustrating a process for reading data from a multiple hash table array of a memory module, according to an embodiment of the present invention.

At operation S801, a read request corresponding to a plurality of the blocks of data stored in the hash table array may be received (e.g., the deduplication DRAM memory module 130 may receive a read request from the memory controller 120 corresponding to a plurality of blocks of data making up a data line C, the blocks of data being stored in the hash table array 400 in the hash table memory 220).

At operation S802, corresponding ones of the pointers corresponding to the plurality of the blocks of data may be retrieved from the ALUTM (e.g., the deduplication DRAM memory module 130 may retrieve address pointers corresponding to the plurality of the blocks of data making up the data line C from the ALUTM 210).

At operation S803, the plurality of the blocks of data based on the corresponding ones of the pointers may be accessed in the hash table memory (e.g., the deduplication DRAM memory module 130 may access and retrieve the blocks of data from different addresses within the hash table array 400 in the hash table memory 220, the different addresses corresponding to the retrieved address pointers).

At operation S804, the plurality of the blocks of data may be reassembled to produced reassembled data (e.g., the deduplication DRAM memory module 130 may reassemble the blocks of data retrieved from the hash table memory 220 to produce reassemble data that may be equivalent to the data line C corresponding to the received read request).

At operation S805, the reassembled data may be sent from the memory module to a memory controller (e.g., the deduplication DRAM memory module 130 may send the data line C to the memory controller 120).

As described above, data deduplication may be performed using the deduplication DRAM memory module of embodiments of the present invention. Accordingly, accessing of the memory can be reduced, and lifespan of the DRAM system can be prolonged.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A deduplication dynamic random-access memory (DRAM) memory module for deduplicating memory by performing deduplication on-chip and reducing duplicate blocks of data in memory to increase a logical capacity of the deduplication DRAM memory module, to reduce use of host processor resources, and to reduce a number of memory accesses to the deduplication DRAM memory module, the deduplication DRAM memory module comprising:
a hash table memory for storing only deduplicated blocks of data;
an address lookup table memory (ALUTM) for storing addresses corresponding to the deduplicated blocks of data; and
a processor for receiving read requests to enable the deduplication DRAM memory module to retrieve the blocks of data from the hash table memory and to export the blocks of data, and for receiving write requests to enable the deduplication DRAM memory module to store the blocks of data in the hash table memory.

2. The deduplication DRAM memory module of claim 1, wherein the hash table memory is stored on a volatile memory, and comprises a three-dimensional array of hash tables stored therein, each of the hash tables comprising physical hash buckets, each physical hash bucket comprising ways and being configured to store the deduplicated blocks of data.

3. The deduplication DRAM memory module of claim 2, wherein each of the hash tables further comprises a plurality of virtual buckets each comprising two or more of the physical hash buckets.

4. The deduplication DRAM memory module of claim 3, wherein the deduplication DRAM memory module is configured to move the deduplicated blocks of data between adjacent ones of the virtual buckets within a corresponding one of the hash tables.

5. The deduplication DRAM memory module of claim 2, wherein the deduplication DRAM memory module is able to perform data deduplication without externally supplied commands.

6. The deduplication DRAM memory module of claim 2, wherein the deduplication DRAM memory module further comprises a buffer memory for storing data when the hash table memory is full.

* * * * *